United States Patent [19]
Ahmad et al.

[11] Patent Number: 6,018,450
[45] Date of Patent: Jan. 25, 2000

[54] OUTPUT DRIVER WITH OVERSHOOT AND UNDERSHOOT PROTECTION

[75] Inventors: Waseem Ahmad, Sunnyvale; Raoul B. Salem, Redwood City, both of Calif.

[73] Assignee: Sun Microsystems, Inc., Palo Alto, Calif.

[21] Appl. No.: 09/197,274

[22] Filed: Nov. 20, 1998

[51] Int. Cl.$^7$ ........................................................ H02H 3/20
[52] U.S. Cl. ............................ 361/90; 361/91.1; 361/92; 323/276
[58] Field of Search ............................... 361/86, 90, 111, 361/91.1, 91.5, 92; 323/275–276, 284–285

[56] References Cited

U.S. PATENT DOCUMENTS

| | | | |
|---|---|---|---|
| 5,138,516 | 8/1992 | Chapman | 361/18 |
| 5,617,051 | 4/1997 | Bingham | 327/317 |

*Primary Examiner*—Michael J. Sherry
*Attorney, Agent, or Firm*—Sabath & Truong; Bobby K. Truong

[57] ABSTRACT

A output driving circuit having an output driving element, an overshoot protection mechanism, and an undershoot protection mechanism. When the overshoot protection mechanism senses an overshoot voltage at the output terminal of the output driving element, it raises the voltage at the control terminal of the output driving element. This serves to maintain the voltage between the output terminal and the control terminal of the output driving element within a safe range, thereby preventing overstress or damage to the element. When the undershoot protection mechanism senses an undershoot voltage at the output terminal of the output driving element, it lowers the voltage at the control terminal of the output driving element. This serves to maintain the voltage between the output terminal and the control terminal of the output driving element within a safe range, which in turn prevents overstress and damage to the element. The output driving circuit also has a recovery circuit for accelerating the process of returning the output driving element to normal operation after the effects of overshoot and undershoot have ceased. This aids in accelerating the operation of the output driving circuit.

20 Claims, 4 Drawing Sheets

OUTPUT DRIVER WITH OVERSHOOT AND UNDERSHOOT PROTECTION

FIELD OF THE INVENTION

This invention relates generally to semiconductor circuits and more particularly to an output driving circuit having overshoot and undershoot protection.

BACKGROUND OF THE INVENTION

Output drivers, or buffers as they are sometimes called, are used in many semiconductor applications to drive the output of a circuit onto an external circuit or onto an output port. These output drivers are used because they provide the necessary current to drive the output signal voltage onto what could be a substantial low impedance load.

A typical prior art output driver is shown in FIG. 1, wherein the driver 100 consists of a pull-up transistor 104, a pull-down transistor 108, and some pre-driver circuits 116, 120 for processing a data signal prior to invoking the driving transistors 104, 108. The pull-up transistor 104, often implemented as a PMOS transistor, typically has a source terminal coupled to a power supply voltage Vdd, a drain terminal coupled to the output port 112 (or external circuit), and a gate terminal coupled to the output of the pre-driver circuit 116. The pull-down transistor 108, often implemented as an NMOS transistor, typically has a drain terminal coupled to the output port 112, a source terminal coupled to ground, and a gate terminal coupled to the output of the pre-driver circuit 120. Depending on the state of the data signal, one of these transistors 104, 108 will conduct to either pull the voltage at the output port 112 up near Vdd or down near ground.

Specifically, in making a low to high transition at the output port 112 (i.e. to drive a high level voltage signal onto the output port), the transistor 104 is turned on by the pre-driver circuit 116 while the transistor 108 is turned off by the pre-driver circuit 120. This causes transistor 104 to conduct, which in turn causes the voltage at the output port 112 to be pulled up near Vdd. Similarly, in making a high to low transition (i.e. to drive a low level voltage signal onto the output port), the transistor 108 is turned on by the pre-driver circuit 120 while the transistor 104 is turned off by the pre-driver circuits 16. This causes transistor 108 to conduct, which in turn causes the voltage at the output port 112 to be pulled down near ground. By selectively turning on transistors 104 and 108, the driver 100 can be used to drive the data signal (or the complement data signal thereof if the driver 100 is an inverting driver) onto the output port 112.

Output drivers can be used in a wide variety of different circuits and applications. In some of these applications, there may exist an impedance mismatch. An impedance mismatch may result, for example, when an output driver is driving an output signal onto a transmission line, and the transmission line path has a terminating load that has an impedance which does not exactly match the characteristic impedance of the transmission line. This impedance mismatch, along with some other factors, may cause a phenomenon known as "reflection" to occur. Basically, a reflection is a voltage experienced by the output driver which is the result of driving an output signal onto an output port and then having that signal reflected back to the driver. Depending upon various factors, the total voltage at the output port, as a result of the reflection, may have a magnitude greater than the original voltage driven onto the output port by the driver. Thus, the reflection voltage may exceed the power supply voltage Vdd (resulting in overshoot), or go below the ground voltage (resulting in undershoot).

Both overshoot and undershoot can cause damage to the transistors of an output driver. To illustrate how this may occur, consider the case where an overshoot occurs. An overshoot occurs when the driver 100 is driving a high signal onto the output port 112, which means that the pull-up transistor 104 is on and the pull-down transistor 108 is off. When the pull-up transistor 104 is on, it has a low voltage (almost ground) at the gate terminal. Likewise, when the pull-down transistor 108 is off, it has a low voltage at the gate terminal. If an overshoot occurs, meaning that a voltage higher than the power supply voltage Vdd appears at the drain terminals of the transistors 104 and 108, a large voltage difference will exist between the drain and the gate of both transistors 104, 108. This large gate-to-drain voltage can overstress and even break the transistors.

Undershoot can damage the transistors in a similar way. Specifically, undershoot occurs when the driver 100 is driving a low signal onto the output port 112, which means that the pull-up transistor 104 is off and the pull-down transistor 108 is on. When the pull-up transistor 104 is off, it has a high voltage (almost Vdd) at the gate terminal. Likewise, when the pull-down transistor 108 is on, it has a high voltage at the gate terminal. If an undershoot occurs, meaning that a voltage lower than the ground voltage appears at the drain terminals of the transistors 104 and 108, a large voltage difference will exist between the drain and the gate of both transistors 104, 108. As noted before, this large gate-to-drain voltage can overstress and even break the transistors.

As this discussion shows, overshoot and undershoot can seriously compromise the integrity and reliability of output drivers. This problem is especially acute when it comes to MOS devices manufactured using sub-micron technology. Sub-micron MOS transistors typically have gate oxide layer thicknesses in the range of tens of Angstroms. With such thin oxide layers, these devices cannot withstand large gate-to-drain voltages. Given the desirability of fabricating small (e.g. sub-micron) semiconductor devices, and the serious problems caused by overshoot and undershoot, a mechanism is needed to address and solve the overshoot/undershoot problem.

SUMMARY OF THE INVENTION

To fill the void left by the prior art output drivers, the present invention provides an improved output driving circuit which overcomes the overshoot/undershoot problem. More specifically, each output driving element (e.g. a pull-up or a pull-down transistor) in the output driving circuit preferably has associated with it a pre-driver circuit which, in addition to activating and deactivating the output driving element, also provides overshoot and undershoot protection for the element. In the case of either an overshoot or an undershoot, the protection mechanisms adjust the voltage at the control terminal (e.g. the gate terminal) of the output driving element such that the voltage between the control terminal and the output terminal (e.g. the drain terminal) of the output driving element is maintained within a safe range. By doing so, the protection mechanisms offset the effects of overshoot and undershoot, and significantly reduce and even possibly eliminate the stress caused thereby. Thus, the present invention provides an effective solution for the overshoot/undershoot problem.

According to a preferred embodiment, the output driving circuit of the present invention comprises an output driving element having an output terminal coupled to an output port, and a control terminal. This element may, for example, be either a pull-up or a pull-down transistor.

The circuit preferably further comprises an overshoot protection element having a control terminal coupled to the output port, and an output terminal coupled to the control terminal of the output driving element. The overshoot protection element, which may take the form of a properly biased transistor, senses an overshoot voltage at the output port and in response, raises the voltage at the control terminal of the output driving element from an original voltage level to an elevated voltage level. This action serves to maintain the voltage between the output terminal and the control terminal of the output driving element within a safe range, thereby preventing overstress and damage to the output driving element.

The output driving circuit preferably further comprises an undershoot protection element having a control terminal coupled to the output port, and an output terminal coupled to the control terminal of the output driving element. The undershoot protection element, which may also take the form of a properly biased transistor, senses an undershoot voltage at the output port and in response, lowers the voltage appearing at the control terminal of the output driving element from an original voltage level to a lower voltage level. By doing so, the undershoot protection element maintains the voltage between the output terminal and the control terminal of the output driving element within a safe range. This in turn prevents overstress and damage to the output driving element.

The output driving circuit preferably further comprises a recovery circuit coupled to the control terminal of the output driving element. This circuit, which may comprise one or more transistors, serves to quickly drive the voltage appearing at the control terminal of the output driving element back to the original voltage level once the overshoot or undershoot has subsided. By doing so, the recovery circuit accelerates the process of returning the output driving element to normal operation after the effects of overshoot and undershoot have ceased, which in turn accelerates the operation of the output driving circuit.

Overall, the present invention provides an effective output driving circuit which not only solves the overshoot/undershoot problem but does so without sacrificing performance.

DETAILED DESCRIPTION OF THE PREFERRED EMBODIMENTS

Figure 1:
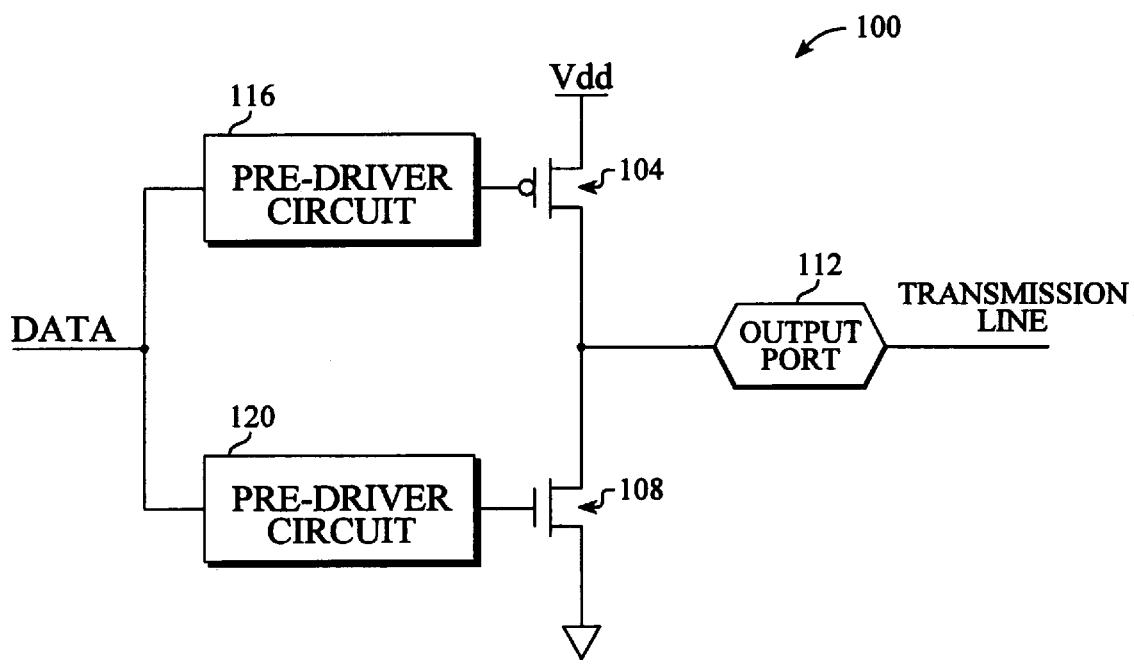
FIG. 1 is a diagrammatic representation of a prior art output driver.
Figure 2:
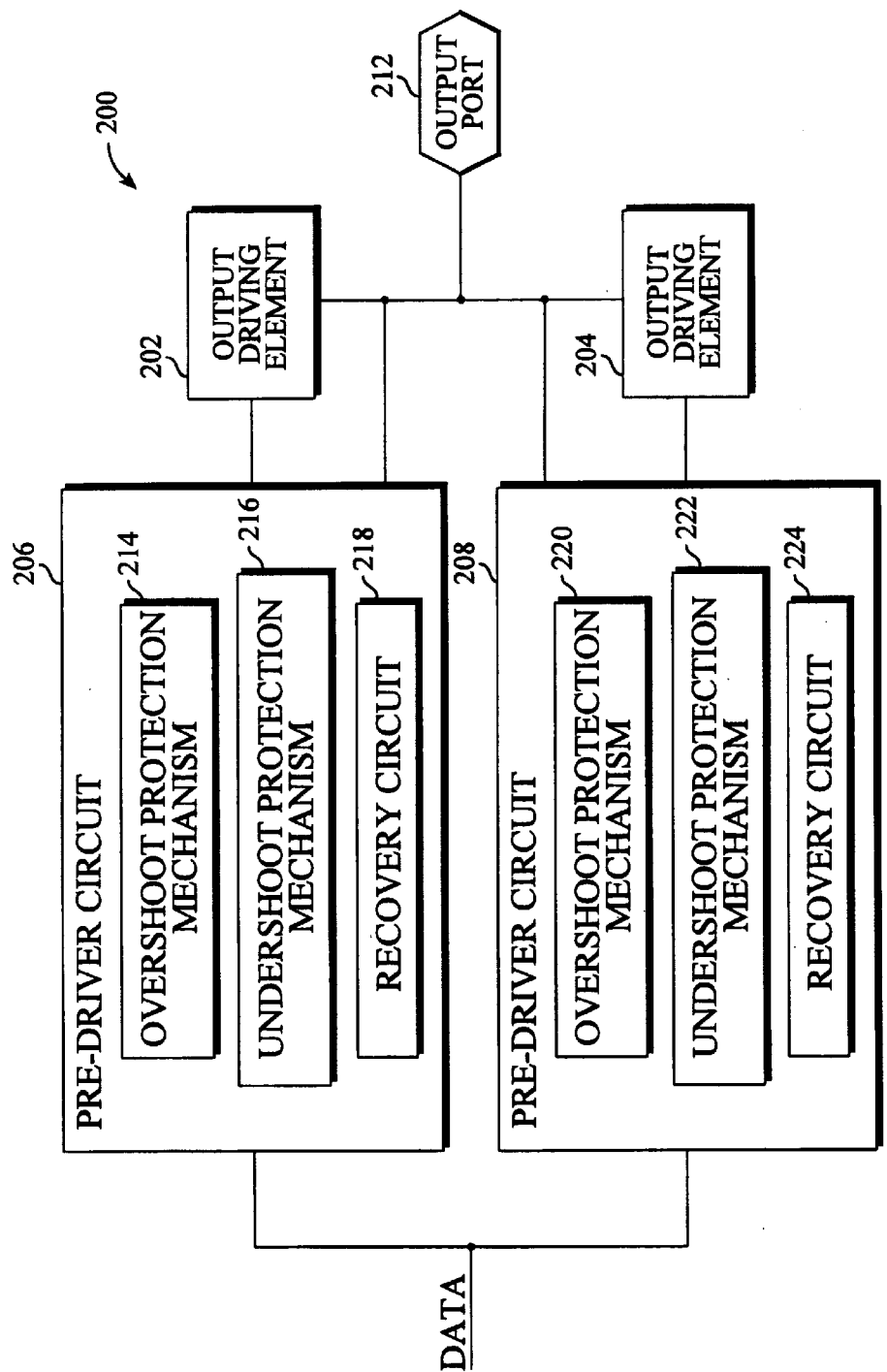
FIG. 2 is a block diagram representation of the output driving circuit of the present invention.

With reference to FIG. 2, there is shown a block diagram of a preferred embodiment of the output driving circuit 200 of the present invention. The output driving circuit 200 preferably comprises a first output driving element 202 having an output terminal coupled to an output port 212, and a control terminal, and a second output driving element 204 having an output terminal coupled to the output port 212, and a control terminal. These elements 202, 204 are responsible for providing the current necessary to drive either a high level signal voltage or a low level signal voltage onto the output port 212. Output driving elements 202, 204 are preferably counterparts of each other such that one is a pull-up element responsible for pulling the voltage at the output port 212 up to a certain high-level voltage, while the other is a pull-down element responsible for pulling the voltage at the output port 212 down to a certain low-level voltage. The operation of these elements 202, 204 is preferably controlled by corresponding pre-driver circuits 206, 208.

Specifically, output driving element 202 preferably has associated with it a pre-driver circuit 206 responsible for controlling its operation. The pre-driver circuit 206 preferably has an input coupled to receive a data signal, another input coupled to the output port 212, and an output coupled to the control terminal of the output driving element 202. One of the primary functions of circuit 206 is to control the activation and deactivation of the output driving element 202 in response to the data signal. In addition, the pre-driver circuit 206 also provides overshoot and undershoot protection for the element 202. Specifically, pre-driver circuit 206 preferably comprises an overshoot protection mechanism 214, an undershoot protection mechanism 216, and a recovery circuit 218.

The overshoot protection mechanism 214 is responsible for offsetting the effects of overshoot at the output port 212 to protect the output driving element 202 from overstress or damage. In carrying out this function, the overshoot protection mechanism 214 monitors the output port 212 (and hence, the output terminal of the output driving element 202 since it is coupled to the output port 212) for an overshoot voltage. If an overshoot voltage is sensed, the overshoot protection mechanism 214 raises the voltage at the control terminal of the output driving element 202. By doing so, the overshoot protection mechanism 214 maintains the voltage between the control terminal and the output terminal of the output driving element 202 within a safe range. This in turn prevents the element 202 from being overstressed or damaged by the overshoot voltage.

The undershoot protection mechanism 216 performs a similar protection function. Namely, the undershoot protection mechanism 216 monitors the output port 212 for an undershoot voltage. If an undershoot voltage is sensed, the undershoot protection mechanism 216 lowers the voltage at the control terminal of the output driving element 202 to maintain the voltage between the control terminal and the output terminal of the output driving element 202 within a safe range. By doing so, the undershoot protection mechanism 216 prevents the element 202 from being overstressed or damaged by the undershoot voltage.

Whenever either protection mechanism 214 or 216 is invoked, the voltage at the control terminal of the output driving element 202 is altered. This voltage alteration may cause the element 202 to turn on when it should be off, or it may alter the conductivity of the element 202 when it is on. While such voltage alteration is desirable for offsetting the effects of overshoot and undershoot, the altered voltage should not be maintained once the overshoot or undershoot voltage has subsided. Otherwise, the operation of the output driving element 202 may be adversely affected. To accelerate the process (referred to as the recovery process) of returning the control terminal to its original voltage, the recovery circuit 218 is provided to quickly drive the voltage at the control terminal back to the level that it had prior to alteration by the protection mechanisms. By accelerating the recovery process, the recovery circuit 218 enables the output driving element 202 to return to normal operation faster, which in turn accelerates the operation of the overall output driving circuit 200. Thus, pre-driver circuit 206 provides overshoot and undershoot protection for the output driving element 202 without sacrificing performance.

Like element 202, output driving element 204 also has associated with it a pre-driver circuit 208 responsible for controlling its operation. The pre-driver circuit 208 preferably has an input coupled to receive the data signal, another input coupled to the output port 212, and an output coupled to the control terminal of the output driving element 204. In addition to controlling the activation and deactivation of the output driving element 204 in response to the data signal, the pre-driver circuit 208 also provides overshoot and undershoot protection for the element 204. Hence, the pre-driver circuit 208 preferably comprises an overshoot protection mechanism 220, an undershoot protection mechanism 222, and a recovery circuit 224. These mechanisms/circuit 220, 222, and 224 serve the same purpose as, and operate in a manner similar to, the corresponding mechanisms/circuit 214, 216, and 218 in the pre-driver circuit 206. Thus, like pre-driver circuit 206, pre-driver circuit 208 provides overshoot and undershoot protection for its corresponding output driving element 204 without sacrificing performance.

Figure 3:
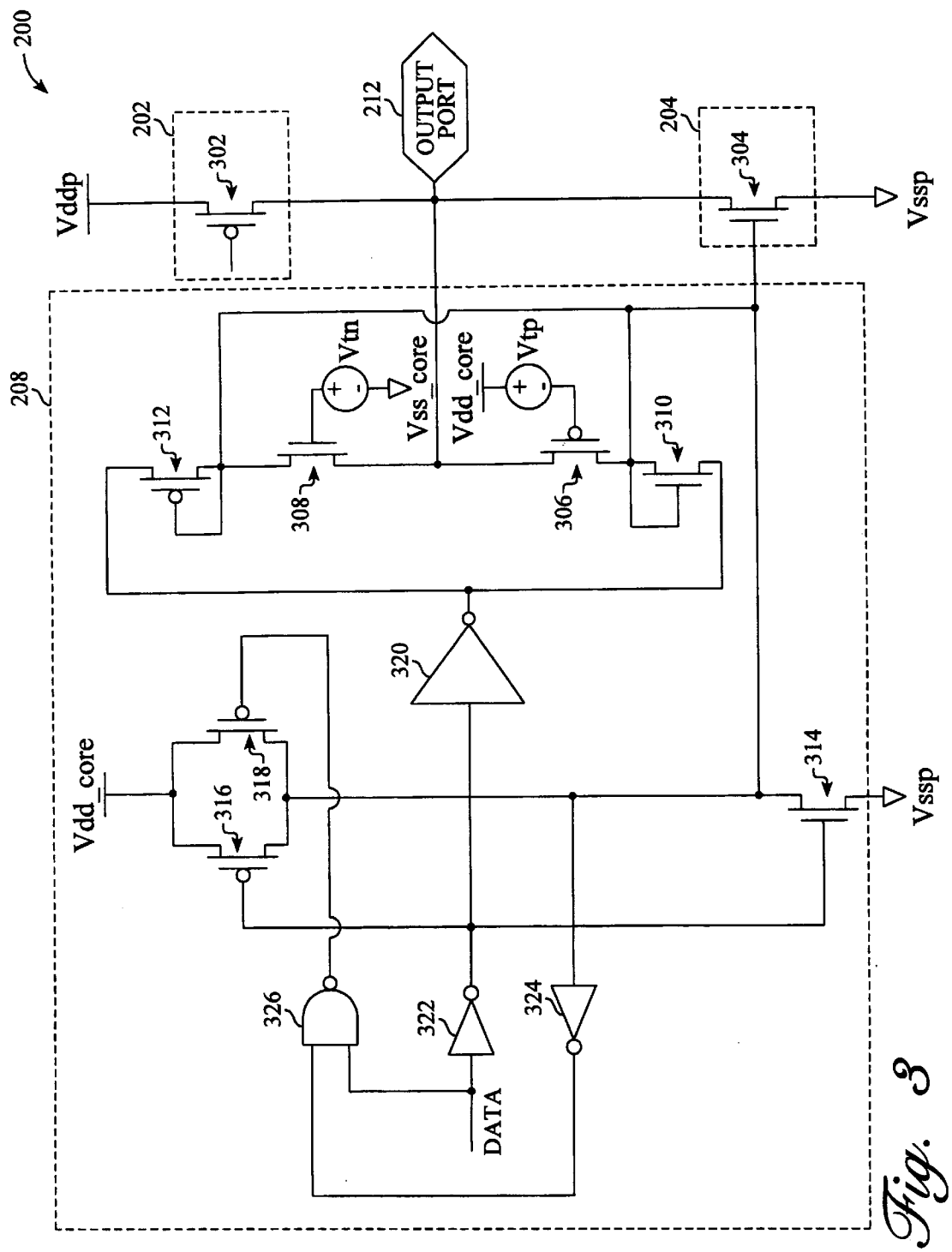
FIG. 3 is a circuit diagram of a portion of the preferred embodiment of the output driving circuit of the present invention, including the pull-up and pull down transistors and the pre-driver circuit associated with the pull-down transistor.
Figure 4:
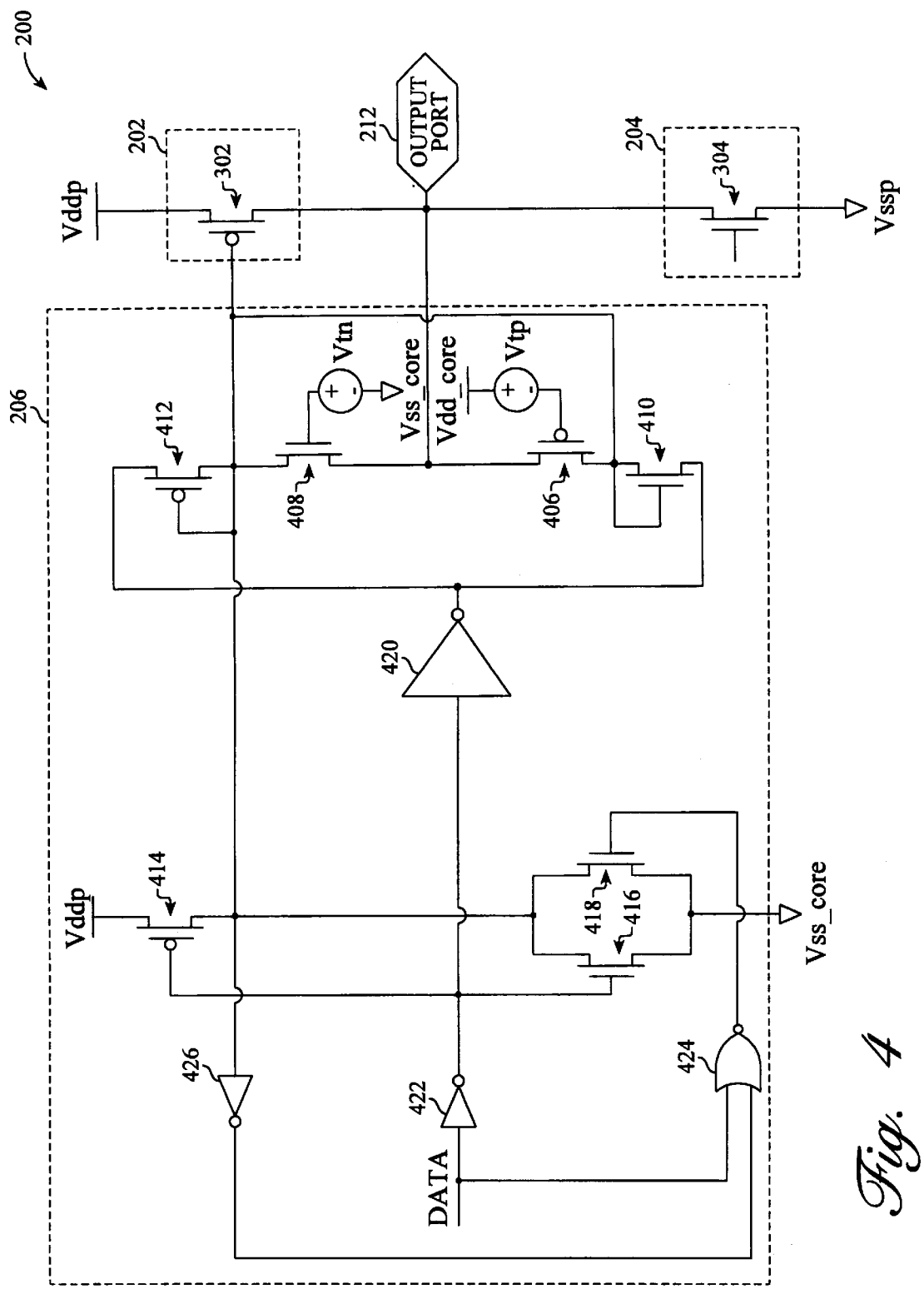
FIG. 4 is a circuit diagram of a portion of the preferred embodiment of the output driving circuit of the present invention, including the pull-up and pull down transistors and the pre-driver circuit associated with the pull-up transistor.

With reference to FIGS. 3 and 4, the output driving circuit 200 of the present invention will now be described in greater detail. FIG. 3 is a partial circuit diagram of a preferred embodiment of the output driving circuit 200, showing the output driving elements 202 and 204, and the pre-driver circuit 208 associated with the element 204. FIG. 4 is a partial circuit diagram of the same preferred embodiment of the output driving circuit 200, except that FIG. 4 shows the output driving elements 202 and 204, and the pre-driver circuit 206 associated with element 202. In the preferred embodiment, PMOS and NMOS transistors are used to implement the invention. However, it should be noted that other types of transistors, including but not limited to other types of MOSFET's, JFET's and BJT's, may also be used. In addition, devices other than transistors which perform the same or similar functions may be substituted.

Two initial observations should be made regarding the preferred embodiment shown in FIGS. 3 and 4. First, the output driving circuit 200 shown is an inverting circuit, meaning that the signal at the output port 212 is the inverse of the data signal. While this aspect of the circuit 200 is not important for purposes of the present invention (the present invention may be implemented as either an inverting or noninverting circuit), it is noted to avoid confusion. Hereinafter, when a reference is made as to a signal going from low to high or high to low, it will be with reference to the signal at the output port 212 and not the data signal, unless specifically stated otherwise. A second observation that should be made is that two different sets of power supply voltages (Vddp and Vdd_core) and ground voltages (Vssp and Vss_core) are used. Vddp and Vssp represent the actual power supply voltage and ground voltage, respectively, which may contain noise signals and ground bounce. On the other hand, Vdd_core and Vss_core represent the reference power supply voltage and the reference ground voltage, respectively, which have been filtered to remove the effects of noise and ground bounce. As discussed below, these reference voltages are used to help detect the overshoot and undershoot voltages.

Referring now to FIG. 3, the output driving circuit 200 preferably comprises a pull-up transistor 302, which acts as the output driving element 202, and a pull-down transistor 304, which acts as the output driving element 204. In the preferred embodiment, transistor 302 takes the form of a PMOS transistor having a source terminal coupled to Vddp, a drain terminal coupled to the output port 212, and a gate terminal coupled to the pre-driver circuit 206 (FIG. 4). Transistor 304, on the other hand, preferably takes the form of an NMOS transistor having a source terminal coupled to actual ground Vssp, a drain terminal coupled to the output port 212, and a gate terminal coupled to the pre-driver circuit 208.

The output driving circuit 200 preferably further comprises the pre-driver circuit 208 responsible for protecting and controlling the operation of transistor 304. The pre-driver circuit 208 preferably comprises a plurality of transistors and logic components, including PMOS transistor 306, NMOS transistor 308, NMOS transistor 310, and PMOS transistor 312. Transistor 306 has a source terminal coupled to the output port 212, a drain terminal coupled to the gate of pull-down transistor 304, and a gate terminal coupled to receive a biasing voltage. Preferably, this biasing voltage is set to a voltage equal to or slightly less than the reference power supply voltage Vdd_core minus the threshold voltage Vtp of the transistor 306. In this embodiment, transistor 306 acts as the overshoot protection mechanism for the pull-down transistor 304. Coupled to the drain terminal of transistor 306 is transistor 310. Transistor 310 has a drain terminal coupled to the drain terminal of transistor 306, a source terminal coupled to the output of inverter 320, and a gate terminal coupled to its own drain terminal. Because the drain and gate terminals of transistor 310 are coupled together, transistor 310 effectively acts like a diode.

Transistor 308 has a source terminal coupled to the output port 212, a drain terminal coupled to the gate of transistor 304, and a gate terminal coupled to receive a biasing voltage. Preferably, this biasing voltage is set to a voltage equal to or slightly greater than the reference ground voltage Vss_core plus the threshold voltage Vtn of the transistor 308. In this embodiment, transistor 308 acts as the undershoot protection mechanism for pull-down transistor 304. Coupled to the drain terminal of transistor 308 is transistor 312. Transistor 312 has a drain terminal coupled to the drain terminal of transistor 308, a source terminal coupled to the output of inverter 320, and a gate terminal coupled to its own drain terminal. Because the drain and gate terminals of transistor 312 are coupled together, transistor 312 effectively acts like a diode.

In addition to transistors 306, 308, 310, and 312, pre-driver circuit 208 preferably further comprises transistors 314, 316, and 318, inverters 320, 322, and 324, and NAND gate 326. Inverter 322 acts as the data signal input receiver of the pre-driver circuit 208, receiving the data signal as input and providing an inverted data signal at its output. This inverted data signal is provided to inverter 320 and to transistors 316 and 314. Transistor 314 has a gate terminal coupled to receive the output of inverter 322. In addition, transistor 314 has a source terminal coupled to actual ground Vssp, and a drain terminal coupled to the gate terminal of pull-down transistor 304. Also coupled to the gate terminal of pull-down transistor 304 are transistor pair 316 and 318. Transistor 316 has a drain terminal coupled to the gate of pull-down transistor 304, a source terminal coupled to the reference power supply voltage Vdd_core, and a gate terminal coupled to the output of inverter 322. Meanwhile, transistor 318 has a drain terminal coupled to the gate of pull-down transistor 304, a source terminal coupled to Vdd_core, and a gate terminal coupled to the output of NAND gate 326.

The NAND gate 326 receives two inputs, one from the data signal and the other from the output of inverter 324. The inverter 324 in turn has its input coupled to the gate of the pull down transistor 304. The output of the NAND gate is fed to the gate terminal of transistor 318. Together, inverter 324 and NAND gate 326 form a pulse generation circuit which generates a pulse that temporarily activates the transistor 318. As explained further below, transistor 318 provides the current needed to quickly switch on the pull-down transistor 304.

The output driving circuit 200 preferably further comprises the pre-driver circuit 206 (see FIG. 4) responsible for protecting and controlling the operation of transistor 302. The pre-driver circuit 206 preferably comprises a plurality of transistors and logic components, including PMOS transistor 406, NMOS transistor 408, NMOS transistor 410, and PMOS transistor 412. Transistor 406 has a source terminal coupled to the output port 212, a drain terminal coupled to the gate of pull-up transistor 302, and a gate terminal coupled to receive a biasing voltage. Preferably, this biasing voltage is set to a voltage equal to or slightly less than the reference power supply voltage Vdd_core minus the threshold voltage Vtp of the transistor 406. In this embodiment, transistor 406 acts as the overshoot protection mechanism for the pull-up transistor 302. Coupled to the drain terminal of transistor 406 is transistor 410. Transistor 410 has a drain terminal coupled to the drain terminal of transistor 406, a source terminal coupled to the output of inverter 420, and a gate terminal coupled to its own drain terminal. Because the drain and gate terminals of transistor 410 are coupled together, transistor 410 effectively acts like a diode.

Transistor 408 has a source terminal coupled to the output port 212, a drain terminal coupled to the gate of transistor 302, and a gate terminal coupled to receive a biasing voltage. Preferably, this biasing voltage is set to a voltage equal to or slightly greater than the reference ground voltage Vss_core plus the threshold voltage Vtn of the transistor 408. In this embodiment, transistor 408 acts as the undershoot protection mechanism for pull-up transistor 302. Coupled to the drain terminal of transistor 408 is transistor 412. Transistor 412 has a drain terminal coupled to the drain terminal of transistor 408, a source terminal coupled to the output of inverter 420, and a gate terminal coupled to its own drain terminal. Because the drain and gate terminals of transistor 412 are coupled together, transistor 412 effectively acts like a diode.

In addition to transistors 406, 408, 410, and 412, pre-driver circuit 206 preferably further comprises transistors 414, 416, and 418, inverters 420, 422, and 426, and NOR gate 424. Inverter 422 acts as the data signal input of the pre-driver circuit 206, receiving the data signal as input and providing an inverted data signal at its output. This inverted data signal is provided to inverter 420 and to transistors 416 and 414. Transistor 414 has a gate terminal coupled to receive the output of inverter 422. In addition, transistor 414 has a source terminal coupled to Vddp, and a drain terminal coupled to the gate terminal of pull-up transistor 302. Also coupled to the gate terminal of pull-up transistor 302 are transistor pair 416 and 418. Transistor 416 has a drain terminal coupled to the gate of pull-up transistor 302, a source terminal coupled to the reference ground Vss_core, and a gate terminal coupled to the output of inverter 422. Meanwhile, transistor 418 has a drain terminal coupled to the gate of pull-up transistor 302, a source terminal coupled to the reference ground Vss_core, and a gate terminal coupled to the output of NOR gate 424.

The NOR gate 424 receives two inputs, one from the data signal and the other from the output of inverter 426. The inverter 426 in turn has its input coupled to the gate of the pull-up transistor 302. The output of the NOR gate is fed to the gate terminal of transistor 418. Together, inverter 426 and NOR gate 424 form a pulse generation circuit which generates a pulse that temporarily activates the transistor 418. As explained further below, transistor 418 provides the current needed to quickly switch on the pull-up transistor 302.

The preferred embodiment of the output driving circuit 200 has been fully disclosed. With reference to FIGS. 3 and 4, the operation of the circuit 200 will now be described. Referring first to FIG. 3, suppose that the data signal makes a transition from high to low. This causes inverter 322 to output a high signal to the gate of transistor 314, which causes transistor 314 to turn on and conduct. When transistor 314 conducts, it pulls the voltage at the gate of pull-down transistor 304 to substantially the actual ground voltage Vssp, which results in turning off the pull-down transistor 304. If pull-down transistor 304 is off, then it means that the pull-up transistor 302 is on. In that case, the voltage at the output port 212 will be pulled up to substantially the actual power supply voltage Vddp, resulting in a high signal being driven onto the output port. Since the output driving circuit 200 is an inverting circuit, this is the expected result.

When a high signal is driven onto the output port 212, an overshoot can occur, meaning that a voltage higher than that driven by the driving circuit 200 can appear at the output port 212. If an overshoot voltage does appear at the output port 212, it will also appear at the drain terminal of pull-down transistor 304 and the source terminal of transistor 306. Because the gate terminal of transistor 306 is biased at a voltage equal to or slightly less than Vdd_core minus the threshold voltage Vtp of the transistor 306, an overshoot voltage higher than Vdd_core at the source terminal will cause the transistor 306 to conduct. When it conducts, transistor 306 will pull the voltage at the gate terminal of pull-down transistor 304 up to an elevated voltage. This serves to reduce the gate-to-drain voltage of the pull-down transistor 304, thereby offsetting the potentially harmful effect of the overshoot voltage on the gate oxide of the pull-down transistor 304. Preferably, transistor 306 raises the gate voltage sufficiently so that the gate-to-drain voltage of pull-down transistor 304 is maintained within a safe range. By doing so, transistor 306 protects the pull-down transistor 304 from the overshoot voltage.

Transistor 306 will conduct so long as an overshoot voltage is present at the output port 212. Once the overshoot voltage has subsided, the transistor 306 will turn off. At that point, transistors 310 and 314, acting as the overshoot recovery circuit, will take over to quickly return the voltage at the gate terminal of pull-down transistor 304 to its original level, which in this case is substantially Vssp. By doing so, transistors 310 and 314 accelerate the process of returning the pull-down transistor 304 to normal, optimal operation, which in turn accelerates the operation of the overall circuit 200. At this point, it should be noted that transistors 310 and 314 are not activated only after transistor 306 is turned off, but rather are on during the entire process. However, because transistor 306 has greater current capacity than transistors 310 and 314, it is able to successfully contend with transistors 310 and 314 while it is on to pull the voltage at the gate terminal of pull-down transistor 304 up to an elevated voltage. Once transistor 306 is off though, transistors 310 and 314 will quickly drive the voltage at the gate terminal of pull-down transistor 304 back down to substantially Vssp.

Cooperating with transistor 314 to accelerate recovery is just one of the functions of the diode-connected transistor 310. Another function of transistor 310 is to limit positive excursion at the gate terminal of pull-down transistor 304 during overshoot. Because transistor 306 is a PMOS transistor and transistor 314 is an NMOS transistor, the balance between the transistors 306, 314 will most likely not remain stable with fabrication process, voltage, and temperature variations. The diode-connected transistor 310 serves to limit the positive excursion caused by these variations during overshoot. By limiting positive excursion at the gate terminal of pull-down transistor 304, transistor 310 facilitates faster recovery. In the manner described, pre-driver circuit 208 protects the pull-down transistor 304 from overshoot.

Suppose now that the data signal makes a transition from low to high. This causes inverter 322 to output a low signal to the gate of transistor 316. It also causes NAND gate 326 to output a low signal to the gate of transistor 318. As a result, both transistors 316 and 318 will turn on and conduct, thereby pulling the voltage at the gate terminal of pull-down transistor 304 up to substantially the reference power supply voltage Vdd_core. This causes the pull-down transistor 304 to be turned on, which in turn causes the voltage at the output port 212 to be pulled down to substantially the actual ground voltage Vssp, resulting in a low signal being driven onto the output port. Since the output driving circuit 200 is an inverting circuit, this is the proper result.

When a low signal is driven onto the output port 212, an undershoot can occur, meaning that a voltage lower than that driven by the driving circuit 200 can appear at the output port 212. If an undershoot voltage does appear at the output port 212, it will also appear at the drain terminal of pull-down transistor 304 and at the source terminal of transistor 308. Because the gate terminal of transistor 308 is biased at a voltage equal to or slightly greater than the reference ground voltage Vss_core plus the threshold voltage Vtn of the transistor 308, an undershoot voltage lower than Vss_core at the source terminal will cause the transistor 308 to conduct. When it conducts, transistor 308 will pull the voltage at the gate terminal of pull-down transistor 304 down to a lower voltage. This serves to reduce the gate-to-drain voltage of the pull-down transistor 304, thereby offsetting the potentially harmful effect of the undershoot voltage on the gate oxide of the pull-down transistor 304. Preferably, transistor 308 lowers the gate voltage sufficiently so that the gate-to-drain voltage of pull-down transistor 304 is maintained within a safe range. By doing so, transistor 308 protects the pull-down transistor 304 from the undershoot voltage.

Transistor 308 will conduct so long as an undershoot voltage is present at the output port 212. Once the undershoot voltage has subsided, the transistor 308 will turn off. At that point, transistors 312 and 316 (and possibly transistor 318), acting as the undershoot recovery circuit, will take over to quickly return the voltage at the gate terminal of pull-down transistor 304 to its original level, which in this case is substantially Vdd_core. By doing so, transistors 312 and 316 accelerate the process of returning the pull-down transistor 304 to normal, optimal operation, which in turn accelerates the operation of the overall circuit 200. At this point, it should be noted that transistors 312 and 316 are not activated only after transistor 308 is turned off, but rather are on during the entire process. However, because transistor 308 has greater current capacity than transistors 312 and 316, it is able to successfully contend with transistors 312 and 316 while it is on to pull the voltage at the gate terminal of pull-down transistor 304 down to a lower voltage. Once transistor 308 is off, though, transistors 312 and 316 will quickly drive the voltage at the gate terminal of pull-down transistor 304 back up to substantially Vdd_core.

In addition to cooperating with transistor 316 to accelerate recovery, diode-connected transistor 312 also limits negative excursion at the gate terminal of pull-down transistor 304 during undershoot. Because transistor 308 is an NMOS transistor and transistor 316 is a PMOS transistor, the balance between the transistors 308, 316 will most likely not remain stable with fabrication process, voltage, and temperature variations. The diode-connected transistor 312 serves to limit the negative excursion caused by these variations during undershoot. By limiting negative excursion at the gate terminal of pull-down transistor 304, transistor 312 facilitates faster recovery.

At this point, it should be noted that the conduction of both diode-connected transistors 310 and 312 is controlled by the output of the inverter 320. Because transistor 312 is a PMOS transistor and transistor 310 is an NMOS transistor, only one of the transistors 310, 312 will conduct at a time. By ensuring that only one of the transistors 310, 312 will conduct at a time, inverter 320 advantageously eliminates simultaneous DC conduction by both transistors 310, 312. In the manner described, pre-driver circuit 208 protects the pull-down transistor 304 from undershoot.

In addition to overshoot and undershoot protection, the pre-driver circuit 208 also preferably comprises circuitry for enhancing the operating speed of the output driving circuit 200. One such circuitry is the recovery circuit, which was previously described. The other is the combination of transistor 318, inverter 324, and NAND gate 326. In the preferred embodiment, transistor 318 takes the form of a "strong" device having significantly higher current capacity than transistor 316. The primary purpose of transistor 318 is to provide the relatively large current needed to quickly turn on the pull-down transistor 304. Transistor 318 is controlled by the pulse generation circuit comprising inverter 324 and NAND gate 326. The purpose of the pulse generation circuit is to generate a pulse of relatively short duration for temporarily activating the transistor 318. Because transistor 318 is controlled by a pulse, it will be turned on only when it is needed (e.g. when it is necessary to turn on the pull-down transistor 304), and turned off at all other times. Thus, in the preferred embodiment, the pull-down transistor 304 is turned on by a strong device (transistor 318) but kept on by a relatively weak device (transistor 316). By having a strong device involved in the turn on process, the pre-driver circuit 208 enables the pull-down transistor 304 to be activated faster. This in turn enables the pull-down transistor 304 to drive a signal onto the output port 212 in a shorter period of time, thereby improving the speed performance of the output driving circuit 200.

With reference to FIG. 4, the operation of the pre-driver circuit 206 associated with the pull-up transistor 302 will now be described. Suppose that the data signal makes a transition from low to high. This causes inverter 422 to output a low signal to the gate of transistor 414, which causes transistor 414 to turn on and conduct. When transistor 414 conducts, it pulls the voltage at the gate of pull-up transistor 302 to substantially the actual power supply voltage Vddp, which results in turning off the pull-up transistor 302. If pull-up transistor 302 is off, then it means that the pull-down transistor 304 is on. In that case, the voltage at the output port 212 will be pulled down to substantially the actual ground voltage Vssp, resulting in a low signal being driven onto the output port. Since the output driving circuit 200 is an inverting circuit, this is the expected result.

When a low signal is driven onto the output port 212, an undershoot can occur, meaning that a voltage lower than that driven by the driving circuit 200 can appear at the output port 212. If an undershoot voltage does appear at the output port 212, it will also appear at the drain terminal of pull-up transistor 302 and the source terminal of transistor 408. Because the gate terminal of transistor 408 is biased at a voltage equal to or slightly greater than the reference ground voltage Vss_core plus the threshold voltage Vtn of the transistor 408, an undershoot voltage lower than Vss_core at the source terminal will cause the transistor 408 to conduct. When it conducts, transistor 408 will pull the voltage at the gate terminal of pull-up transistor 302 down to a lower voltage. This serves to reduce the gate-to-drain voltage of the pull-up transistor 302, thereby offsetting the potentially harmful effect of the undershoot voltage on the gate oxide of the pull-up transistor 302. Preferably, transistor 408 lowers the gate voltage sufficiently so that the gate-to-drain voltage of pull-up transistor 302 is maintained within a safe range. By doing so, transistor 408 protects the pull-up transistor 302 from the undershoot voltage.

Transistor 408 will conduct so long as an undershoot voltage is present at the output port 212. Once the undershoot voltage has subsided, the transistor 408 will turn off. At that point, transistors 412 and 414, acting as the undershoot recovery circuit, will take over to quickly return the voltage at the gate terminal of pull-up transistor 302 to its original level, which in this case is substantially Vddp. By doing so, transistors 412 and 414 accelerate the process of returning the pull-up transistor 302 to normal, optimal operation, which in turn accelerates the operation of the overall circuit 200. At this point, it should be noted that transistors 412 and 414 are not activated only after transistor 408 is turned off, but rather are on during the entire process. However, because transistor 408 has greater current capacity than transistors 412 and 414, it is able to successfully contend with transistors 412 and 414 while it is on to pull the voltage at the gate terminal of pull-up transistor 302 down to a lower voltage. Once transistor 408 is off, though, transistors 412 and 414 will quickly drive the voltage at the gate terminal of pull-up transistor 302 back up to substantially Vddp.

In addition to cooperating with transistor 414 to accelerate recovery, diode-connected transistor 412 also limits negative excursion at the gate terminal of pull-up transistor 302 during undershoot. Because transistor 408 is an NMOS transistor and transistor 414 is a PMOS transistor, the balance between the transistors 408, 414 will most likely not remain stable with fabrication process, voltage, and temperature variations. The diode-connected transistor 412 serves to limit the negative excursion caused by these variations during undershoot. By limiting negative excursion at the gate terminal of pull-up transistor 302, transistor 412 facilitates faster recovery. In the manner described, pre-driver circuit 206 protects the pull-up transistor 302 from undershoot.

Suppose now that the data signal makes a transition from high to low. This causes inverter 422 to output a high signal to the gate of transistor 416. It also causes NOR gate 424 to output a high signal to the gate of transistor 418. As a result, both transistors 416 and 418 will turn on and conduct, thereby pulling the voltage at the gate terminal of pull-up transistor 302 down to substantially the reference ground voltage Vss_core. This causes the pull-up transistor 302 to be turned on, which in turn causes the voltage at the output port 212 to be pulled up to substantially the actual power supply voltage Vddp, resulting in a high signal being driven onto the output port. Since the output driving circuit 200 is an inverting circuit, this is the proper result.

When a high signal is driven onto the output port 212, an overshoot can occur, meaning that a voltage higher than that driven by the driving circuit 200 can appear at the output port 212. If an overshoot voltage does appear at the output port 212, it will also appear at the drain terminal of pull-up transistor 302 and at the source terminal of transistor 406. Because the gate terminal of transistor 406 is biased at a voltage equal to or slightly less than the reference power supply voltage Vdd_core minus the threshold voltage Vtp of the transistor 406, an overshoot voltage higher than Vdd_core at the source terminal will cause the transistor 406 to conduct. When it conducts, transistor 406 will pull the voltage at the gate terminal of pull-up transistor 302 up to an elevated voltage. This serves to reduce the gate-to-drain voltage of the pull-up transistor 302, thereby offsetting the potentially harmful effect of the overshoot voltage on the gate oxide of the pull-up transistor 302. Preferably, transistor 406 raises the gate voltage sufficiently so that the gate-to-drain voltage of pull-up transistor 302 is maintained within a safe range. By doing so, transistor 406 protects the pull-up transistor 302 from the overshoot voltage.

Transistor 406 will conduct so long as an overshoot voltage is present at the output port 212. Once the overshoot voltage has subsided, the transistor 406 will turn off. At that point, transistors 410 and 416 (and possibly transistor 418), acting as the overshoot recovery circuit, will take over to quickly return the voltage at the gate terminal of pull-up transistor 302 to its original level, which in this case is substantially Vss_core. By doing so, transistors 410 and 416 accelerate the process of returning the pull-up transistor 302 to normal, optimal operation, which in turn accelerates the operation of the overall circuit 200. At this point, it should be noted that transistors 410 and 416 are not activated only after transistor 406 is turned off, but rather are on during the entire process. However, because transistor 406 has greater current capacity than transistors 410 and 416, it is able to successfully contend with transistors 410 and 416 while it is on to pull the voltage at the gate terminal of pull-up transistor 302 up to an elevated voltage. Once transistor 406 is off, though, transistors 410 and 416 will quickly drive the voltage at the gate terminal of pull-up transistor 302 back down to substantially Vss_core.

Cooperating with transistor 416 to accelerate recovery is just one of the functions of the diode-connected transistor 410. Another function of transistor 410 is to limit positive excursion at the gate terminal of pull-up transistor 302 during overshoot. Because transistor 406 is a PMOS transistor and transistor 416 is an NMOS transistor, the balance between the transistors 406, 416 will most likely not remain stable with fabrication process, voltage, and temperature variations. The diode-connected transistor 410 serves to limit the positive excursion caused by these variations during overshoot. By limiting positive excursion at the gate terminal of pull-up transistor 302, transistor 410 facilitates faster recovery.

At this point, it should be noted that the conduction of both diode-connected transistors 410 and 412 is controlled by the output of the inverter 420. Because transistor 412 is a PMOS transistor and transistor 410 is an NMOS transistor, only one of the transistors 410, 412 will conduct at a time. By ensuring that only one of the transistors 410, 412 will conduct at a time, inverter 420 advantageously eliminates simultaneous DC conduction by both transistors 410, 412. In the manner described, pre-driver circuit 206 protects the pull-up transistor 302 from overshoot.

In addition to overshoot and undershoot protection, the pre-driver circuit 206 also preferably comprises circuitry for enhancing the operating speed of the output driving circuit 200. One such circuitry is the recovery circuit, which was previously described. The other is the combination of transistor 418, inverter 426, and NOR gate 424. In the preferred embodiment, transistor 418 takes the form of a "strong" device having significantly higher current capacity than transistor 416. The primary purpose of transistor 418 is to provide the relatively large current needed to quickly turn on the pull-up transistor 302. Transistor 418 is controlled by the pulse generation circuit comprising inverter 426 and NOR gate 424. The purpose of the pulse generation circuit is to generate a pulse of relatively short duration for temporarily activating the transistor 418. Because transistor 418 is controlled by a pulse, it will be turned on only when it is needed (e.g. when it is necessary to turn on the pull-up transistor 302), and turned off at all other times. Thus, in the preferred embodiment, the pull-up transistor 302 is turned on by a strong device (transistor 418) but kept on by a relatively weak device (transistor 416). By having a strong device involved in the turn on process, the pre-driver circuit 206 enables the pull-up transistor 302 to be activated faster. This in turn enables the pull-up transistor 302 to drive a signal onto the output port 212 in a shorter period of time, thereby improving the speed performance of the output driving circuit 200.

At this point, it should be noted that although the invention has been described with reference to specific embodiments, it should not be construed to be so limited. Various modifications can be made by those of ordinary skill in the art with the benefit of this disclosure without departing from the spirit of the invention. Thus, the invention should not be limited by the specific embodiments used to illustrate it but only by the scope of the appended claims.

What is claimed is:

1. An output driving circuit, comprising:

an output driving element having an output terminal coupled to an output port, and a control terminal; and an overshoot protection element having a control terminal coupled to the output port, and an output terminal coupled to the control terminal of said output driving element, said overshoot protection element sensing an overshoot voltage at the output port and in response, raising the voltage appearing at the control terminal of said output driving element from an original voltage level to an elevated voltage level, thereby maintaining the voltage between the output terminal of said output driving element and the control terminal of said output driving element within a safe range.

2. The output driving circuit of claim 1, wherein said overshoot protection element comprises:

a transistor having a source terminal coupled to the output port, a drain terminal coupled to the control terminal of said output driving element, and a gate terminal coupled to receive a biasing voltage.

3. The output driving circuit of claim 1, further comprising:

a recovery circuit coupled to the control terminal of said output driving element, said recovery circuit quickly driving the voltage appearing at the control terminal of said output driving element back to the original voltage level once the voltage overshoot at the output port has subsided.

4. The output driving circuit of claim 3, wherein said overshoot protection element comprises a first transistor having a source terminal coupled to the output port, a drain terminal coupled to the control terminal of said output driving element, and a gate terminal coupled to receive a biasing voltage; and wherein said recovery circuit comprises a second transistor having a drain terminal coupled to the control terminal of said output driving element, a gate terminal coupled to the drain terminal of said second transistor, and a source terminal coupled to receive an input data signal.

5. The output driving circuit of claim 4, wherein said output driving element is a pull-down transistor; and wherein said recovery circuit further comprises a third transistor having a drain terminal coupled to the control terminal of said output driving element, a gate terminal coupled to receive an inverted input data signal, and a source terminal coupled to ground.

6. The output driving circuit of claim 5, wherein said first transistor has greater current capacity than said second and third transistors.

7. The output driving circuit of claim 4, wherein said output driving element is a pull-up transistor, and wherein said output driving circuit further comprises:

a third transistor having a drain terminal coupled to the control terminal of said output driving element, a source terminal coupled to ground, and a gate terminal coupled to receive an inverted input data signal; and a fourth transistor having a drain terminal coupled to the control terminal of said output driving element, a source terminal coupled to ground, and a gate terminal coupled to receive a control pulse.

8. The output driving circuit of claim 7, wherein said fourth transistor has greater current capacity than said third transistor.

9. The output driving circuit of claim 8, wherein said first transistor has greater current capacity than said second and third transistors.

10. The output driving circuit of claim 9, further comprising a pulse generation circuit for generating said control pulse, said pulse generation circuit comprising:

an inverter having an input coupled to the control terminal of said output driving element, and an output; and a NOR gate having a first input coupled to receive an input data signal, a second input coupled to the output of said inverter, and an output coupled to the gate terminal of said fourth transistor.

11. An output driving circuit, comprising:

an output driving element having an output terminal coupled to an output port, and a control terminal; and an undershoot protection element having a control terminal coupled to the output port, and an output terminal coupled to the control terminal of said output driving element, said undershoot protection element sensing an undershoot voltage at the output port and in response, lowering the voltage appearing at the control terminal of said output driving element from an original voltage level to a lower voltage level, thereby maintaining the voltage between the output terminal of said output driving element and the control terminal of said output driving element within a safe range.

12. The output driving circuit of claim 11, wherein said undershoot protection element comprises:

a transistor having a source terminal coupled to the output port, a drain terminal coupled to the control terminal of said output driving element, and a gate terminal coupled to receive a biasing voltage.

13. The output driving circuit of claim 11, further comprising:

a recovery circuit coupled to the control terminal of said output driving element, said recovery circuit quickly driving the voltage appearing at the control terminal of said output driving element back to the original voltage level once the voltage undershoot at the output port has subsided.

14. The output driving circuit of claim 13, wherein said undershoot protection element comprises a first transistor having a source terminal coupled to the output port, a drain terminal coupled to the control terminal of said output driving element, and a gate terminal coupled to receive a biasing voltage; and wherein said recovery circuit comprises a second transistor having a drain terminal coupled to the control terminal of said output driving element, a gate terminal coupled to the drain terminal of said second transistor, and a source terminal coupled to receive an input data signal.

15. The output driving circuit of claim 14, wherein said output driving element is a pull-up transistor; and wherein said recovery circuit further comprises a third transistor having a drain terminal coupled to the control terminal of said output driving element, a gate terminal coupled to receive an inverted input data signal, and a source terminal coupled to receive a power supply voltage.

16. The output driving circuit of claim 15, wherein said first transistor has greater current capacity than said second and third transistors.

17. The output driving circuit of claim 14, wherein said output driving element is a pull-down transistor, and wherein said output driving circuit further comprises:

a third transistor having a drain terminal coupled to the control terminal of said output driving element, a source terminal coupled to receive a power supply voltage, and a gate terminal coupled to receive an inverted input data signal; and a fourth transistor having a drain terminal coupled to the control terminal of said output driving element, a source terminal coupled to receive a power supply voltage, and a gate terminal coupled to receive a control pulse.

18. The output driving circuit of claim 17, wherein said fourth transistor has greater current capacity than said third transistor.

19. The output driving circuit of claim 18, wherein said first transistor has greater current capacity than said second and third transistors.

20. The output driving circuit of claim 19, further comprising a pulse generation circuit for generating said control pulse, said pulse generation circuit comprising:

an inverter having an input coupled to the control terminal of said output driving element, and an output; and a NAND gate having a first input coupled to receive an input data signal, a second input coupled to the output of said inverter, and an output coupled to the gate terminal of said fourth transistor.

* * * * *